(12) United States Patent
Wei

(10) Patent No.: US 7,003,716 B2
(45) Date of Patent: Feb. 21, 2006

(54) METHOD AND APPARATUS FOR USING MULTI-DIMENSIONAL TRELLIS CODES OVER MULTI-PATH CHANNELS

(75) Inventor: Lee-Fang Wei, Lincroft, NJ (US)

(73) Assignee: ZyDAS Technology Corp., (TW)

( * ) Notice: Subject to any disclaimer, the term of this patent is extended or adjusted under 35 U.S.C. 154(b) by 419 days.

(21) Appl. No.: 10/329,896

(22) Filed: Dec. 26, 2002

(65) Prior Publication Data

US 2004/0128610 A1   Jul. 1, 2004

(51) Int. Cl.
   *H03M 13/03*    (2006.01)
(52) U.S. Cl. ............... 714/792; 714/786; 375/341; 375/265
(58) Field of Classification Search ............ 714/792, 714/786, 746, 755; 375/341, 347, 261, 265
   See application file for complete search history.

(56) References Cited

U.S. PATENT DOCUMENTS

| 4,713,817 A | | 12/1987 | Wei ............................. 371/43 |
| 5,422,995 A | * | 6/1995 | Aoki et al. ................... 345/545 |
| 5,872,817 A | * | 2/1999 | Wei ............................ 375/341 |
| 6,144,711 A | * | 11/2000 | Raleigh et al. ............. 375/347 |
| 6,151,370 A | | 11/2000 | Wei ............................. 375/341 |
| 6,266,795 B1 | * | 7/2001 | Wei ............................. 714/755 |
| 6,343,103 B1 | * | 1/2002 | Lou et al. ................... 375/261 |
| 6,891,897 B1 | * | 5/2005 | Bevan et al. .............. 375/265 |
| 2002/0090035 A1 | * | 7/2002 | Seshadri et al. ........... 375/265 |

OTHER PUBLICATIONS

Lee-Fang Wei, "Trellis-coded modulation with multidimensional constellations", IEEE Trans. Inform. Theory, vol. IT-33, pp. 483-501, Jul. 1987.

* cited by examiner

*Primary Examiner*—Albert Decady
*Assistant Examiner*—Dipakkumar Gandhi

(57) ABSTRACT

An approach for using multi-dimensional trellis codes in a communication system over a multi-path channel, such as a wireless local area network, is provided. In this approach, the received signal is equalized and decoded by a joint decision feedback equalizer and multi-dimensional trellis decoder that is based on a multi-stage trellis diagram. The multi-stage trellis diagram used by the decoder comprises at least two stages of state transitions for each stage of state transitions in the encoder. The multi-stage trellis diagram makes the joint decision feedback equalizer and multi-dimensional trellis decoder possible, which in turn makes the use of multi-dimensional trellis codes in such a communication system advantageous.

45 Claims, 9 Drawing Sheets

METHOD AND APPARATUS FOR USING MULTI-DIMENSIONAL TRELLIS CODES OVER MULTI-PATH CHANNELS

FIELD OF THE INVENTION

The present invention relates to a method and apparatus for using multi-dimensional trellis codes in a communication system over multi-path channels.

BACKGROUND OF THE INVENTION

Trellis-coded modulation, also referred to as trellis code, is a power-efficient and spectral-efficient combined coding and modulation technique. The technique is most useful in a communication system that uses a signal constellation other than 2-PAM (Pulse Amplitude Modulation), 2-PSK (Phase Shift Keying), or 4-PSK to deliver a higher data rate for a given signal bandwidth.

Trellis codes may be divided into two categories. The first category uses one or two-dimensional signal constellations whose signal points have one or two coordinates. And the second category uses multi-dimensional or more-than-two-dimensional signal constellations whose signal points have more than two coordinates. Note that, although the signal point in the second category has more than two coordinates, those coordinates are typically transmitted one or two each time, depending on whether the modulator uses amplitude or quadrature-amplitude modulation (QAM).

A major advantage of the multi-dimensional trellis code over one- or two-dimensional trellis code is that the multi-dimensional trellis code generates fewer redundant bits. As a result, for a given constellation size of the modulator, the multi-dimensional trellis code can deliver a higher data rate. Or equivalently, for a given data rate, the multi-dimensional trellis code requires a smaller constellation in the modulator. Generally speaking, the smaller the constellation is, the more robust the communication system is. Multi-dimensional trellis codes are therefore the preferred trellis codes when there are no other system issues involved (such as inter-symbol interference to be further discussed below).

Since mid-1980s, trellis codes have been successfully applied to many popular communication systems. To mention some of them, a two-dimensional 8-state trellis code was first adopted in ITU (International Telecommunications Union) standards on telephone-line modems at rates up to 14.4 kbps in the 1980s. Three four-dimensional trellis codes were then adopted in ITU standards on all of the more advanced telephone-line modems at rates up to 56 kbps in the 1990s. Meanwhile, a four-dimensional 16-state trellis code was adopted in an ITU standard on the asymmetrical digital subscriber line at rates up to 8 Mbps, and a four-dimensional 8-state trellis code was adopted in an IEEE standard on the gigabit ethernet. The number of states of a trellis code refers to the number of states in its encoder, which is a finite-state machine.

An important issue that is involved in all of the communication systems mentioned above is how to deal with the inter-symbol interference (ISI) introduced by the multi-path communication channel. In the telephone-line modems at rates up to 14.4 kbps, the ISI is mild and can be handled by using a feedforward equalizer in the receiver, which does not pose any problem to the communication system with a trellis code. In the more advanced telephone-line modems at rates up to 56 kbps, the ISI is quite severe because of the higher signaling rate. Fortunately, telephone-line modem is a point-to-point communication system and the communication channel is quite stationary. In that case, the transmitter can use a precoder to pre-compensate the ISI to be introduced by the channel, which again does not pose any problem to the communication system with a trellis code. In the asymmetrical digital subscriber lines, the ISI issue is avoided by using an orthogonal frequency division multiplexing (OFDM) modulation technique, together with a dynamic bit allocation method that allocates different number of bits to different frequencies.

In the gigabit ethernet, the ISI is also severe. Because the ethernet is supposed to be a point-to-multi-point communication system, the precoding technique cannot be used. As a result, a decision feedback equalizer (DFE) has to be used in the receiver. Due to the error propagation effect of the DFE, the DFE has to be used in a joint manner with the four-dimensional trellis decoder. This seems to pose a problem. However, the gigabit ethernet uses four twisted pairs for transmission. The four coordinates of each 4-dimensional signal point generated by the four-dimensional trellis encoder are transmitted in four different twisted pairs at the same time. In that case, a conventional joint DFE and trellis decoder, such as those described in U.S. Pat. No. 6,151,370, "Path-Oriented Decoder for Signal-Dependent Noise," issued in November 2000, can be used. The operation of the joint DFE and four-dimensional trellis decoder for the gigabit ethernet is based on a conventional single-stage trellis diagram. In that diagram, each transition from a current state to a next state is associated with a four-dimensional subset of the four-dimensional signal constellation. With that single-stage trellis diagram, reliable tentative decisions on the past four-dimensional signal points can be made and used in the DFE to remove their interferences on the present received four-dimensional signal point before any further decoding processing on the present received four-dimensional signal point takes place. There is no need to worry about the interferences among the coordinates of each 4-dimensional signal point in the DFE since they are transmitted at the same time. The use of four twisted pairs in the gigabit ethernet thus avoids a potential conflict between the DFE and mult-dimensional trellis decoder in the receiver.

It would be desirable to keep using and enjoying the benefits of mult-dimensional trellis codes in other communication systems. However, in case where the communication channel has severe ISI, the transmitter cannot use a preceding technique to pre-compensate the ISI, and there are no multiple channels available to transmit all the coordinates of a mult-dimensional signal point at the same time, is it still possible to do joint decision feedback equalization and mult-dimensional trellis decoding in an effective manner? This is the question to be answered by the present invention.

SUMMARY OF THE INVENTION

A primary goal of the present invention is to use mult-dimensional trellis codes in a communication system over multi-path channels, where not all the coordinates of a mult-dimensional signal point can be transmitted at the same time, and where the ISI of the channel is so severe that it calls for the use of a DFE in the receiver. A good example for such a communication system is a wireless local area network.

The goal is achieved by the present invention of doing decision feedback equalization and mult-dimensional trellis decoding in a joint manner, which is in turn made possible by the present invention of representing a mult-dimensional trellis code with a multi-stage trellis diagram.

According to the present invention, an N-dimensional trellis encoder encodes the input data into a sequence of N-dimensional signal points, each signal point being a concatenation of N/M M-dimensional symbols with N/M being an integer greater than one, and each M-dimensional symbol being selected from a constituent M-dimensional signal constellation. The N/M M-dimensional symbols of an N-dimensional signal point are then modulated and transmitted to a multi-path channel in at least two different M-dimensional signaling intervals.

In the receiver, the channel-impaired M-dimensional symbols are equalized and decoded by a joint DFE and N-dimensional trellis decoder that is based on a multi-stage trellis diagram. The multi-stage trellis diagram used by the decoder comprises at least two stages of state transitions for each stage of state transitions in the corresponding encoder. In other words, for each transition from a current state to a next state in the encoder, the decoder will go from the current state to at least one intermediate state before it reaches the next state.

With the multi-stage trellis diagram, reliable tentative decisions on all of the past M-dimensional symbols can be made and used by the DFE to remove their interferences on the present received M-dimensional symbols before any further decoding operation on the present received M-dimensional symbols takes place. The multi-stage trellis diagram thus makes the joint decision feedback equalization and mult-dimensional trellis decoding possible, which in turn enables the use of mult-dimensional trellis codes in a communication system over a multi-path channel.

Based on the multi-stage trellis diagram, many joint DFE and mult-dimensional trellis decoder can be designed. In a preferred embodiment, the joint DFE and decoder is based on a path-oriented decoder, where different surviving paths retained by the decoder may lead to the same state of the trellis diagram. In another preferred embodiment, the joint DFE and decoder is based on a state-oriented decoder, such as a Viterbi or reduced-state Viterbi decoder, where different surviving paths retained by the decoder are required to lead to different states of the trellis diagram. In both embodiments, more than one decision feedback equalizers are used, each equalizer being associated with a surviving path.

The foregoing and other objects, features, aspects and advantages of the present invention will become better understood from a careful reading of a detailed description provided herein below with appropriate reference to the accompanying drawings.

DETAILED DESCRIPTION OF THE INVENTION

Figure 1:
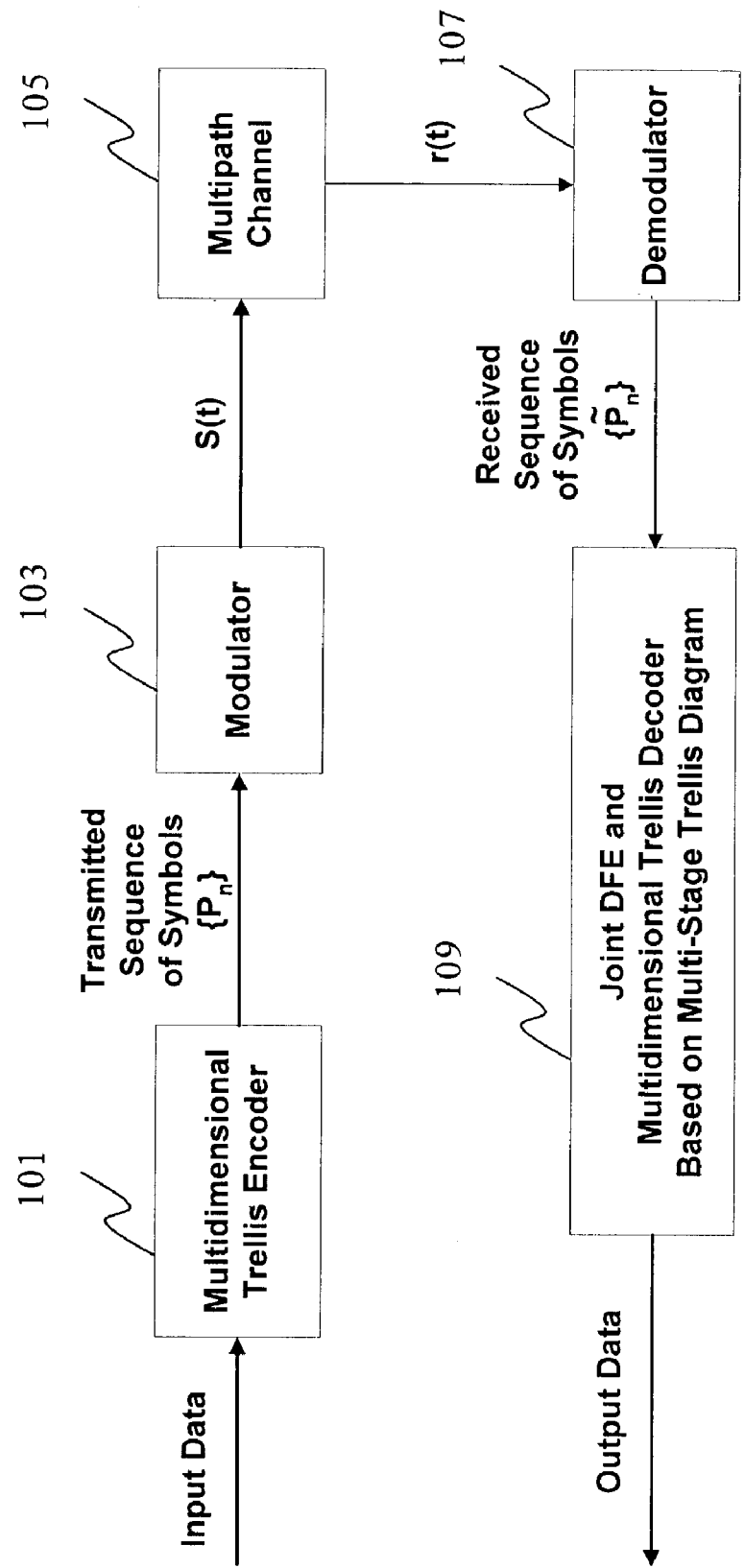
FIG. 1 shows a block diagram for a communication system according to the present invention.

A block diagram for a communication system in which the present invention is used is shown in FIG. 1. Referring to FIG. 1, in the transmitter, the input data are first encoded by mult-dimensional trellis encoder 101 to become a sequence of symbols, $\{P_n\}$, each symbol being typically selected from a two-dimensional (2D) signal constellation. Each symbol $P_n$ is then used to modulate the in-phase and quadrature-phase amplitudes of a single carrier through modulator 103 and transmitted to multi-path channel 105 in the $n^{th}$ signaling interval, each interval being T seconds long. For easy reference, the signaling interval that carries a symbol here is also referred to as a 2D signaling interval.

In the receiver, the received signal r(t) is first processed by demodulator 107, whose output is a sequence of channel-impaired symbols, $\{\tilde{P}_n\}$. Note that the output of demodulator 107 may be sampled at a rate higher than the signaling rate 1/T. For easy discussion, that output is sampled at the signaling rate here and in the detailed description below. The impairments include additive noise and ISI that is caused by multi-path channel 105. As mentioned earlier, the case of interest in the present invention is where the ISI is so severe that it calls for the use of a DFE in the receiver. An example is the channel for a typical wireless local area network.

The sequence of channel-impaired symbols, $\{\tilde{P}_n\}$, is then processed by joint DFE and mult-dimensional trellis decoder 109 to recover the transmitted sequence of symbols, $\{P_n\}$) or equivalently, the corresponding input data. Joint DFE and mult-dimensional trellis decoder 109 is based on a novel "multi-stage" trellis diagram of the mult-dimensional trellis code. Without the "multi-stage" trellis diagram, it would have been impossible to do decision feedback equalization and mult-dimensional trellis decoding in a joint manner. And without the joint DFE and decoder, it would have been a failure to use a mult-dimensional trellis code for such a multi-path channel.

Figure 2:
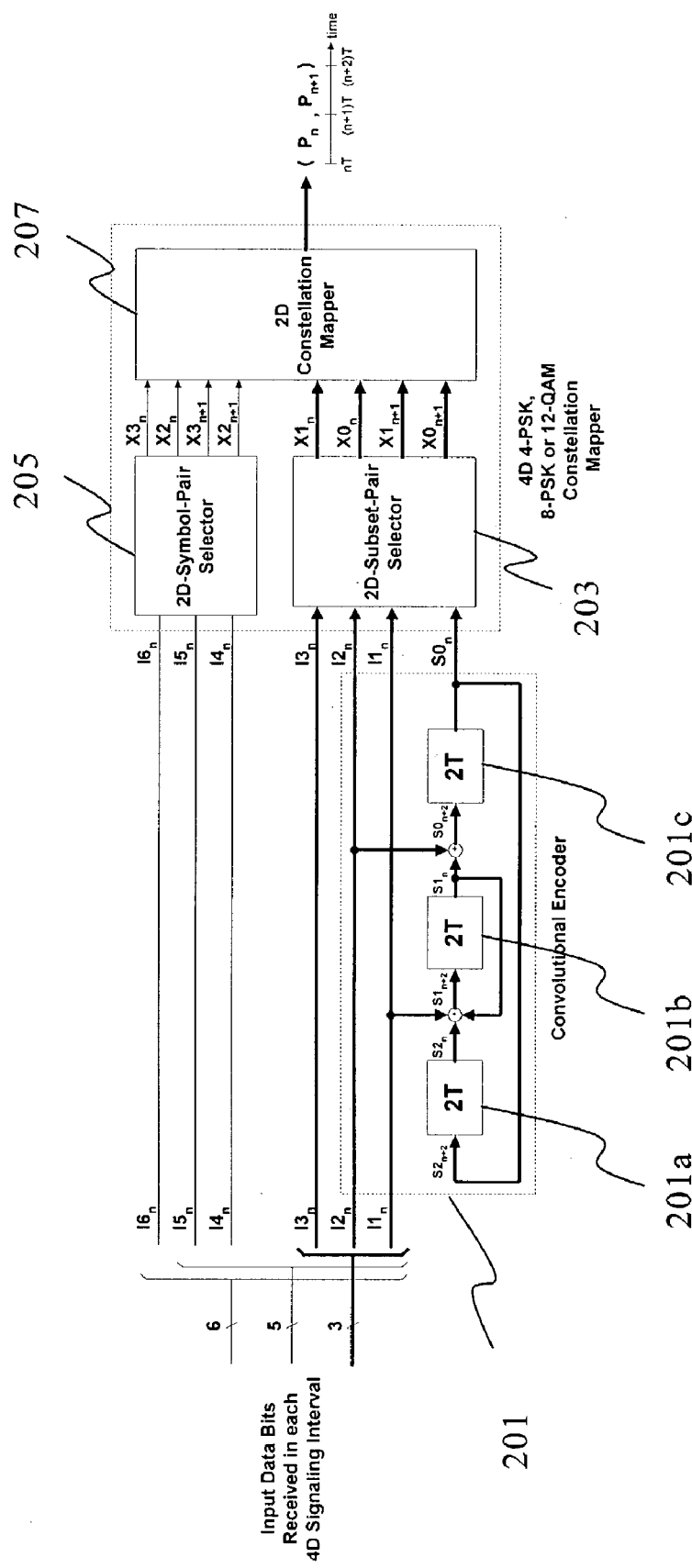
FIG. 2 shows an embodiment for a 4-dimensional 8-state trellis encoder with a 4-PSK, 8-PSK, or 12-QAM signal constellation that is used in the present invention.
Figure 3:
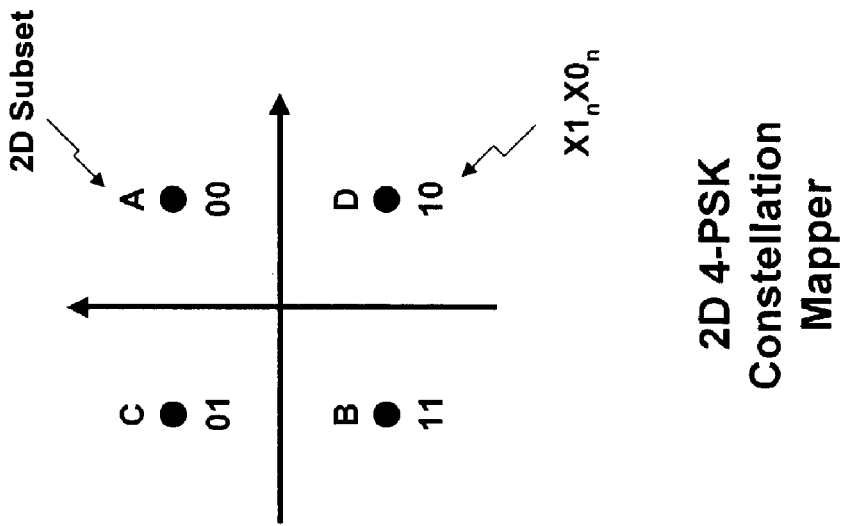
FIG. 3 shows a 4-PSK constellation mapper for the encoder of FIG. 2.
Figure 4:
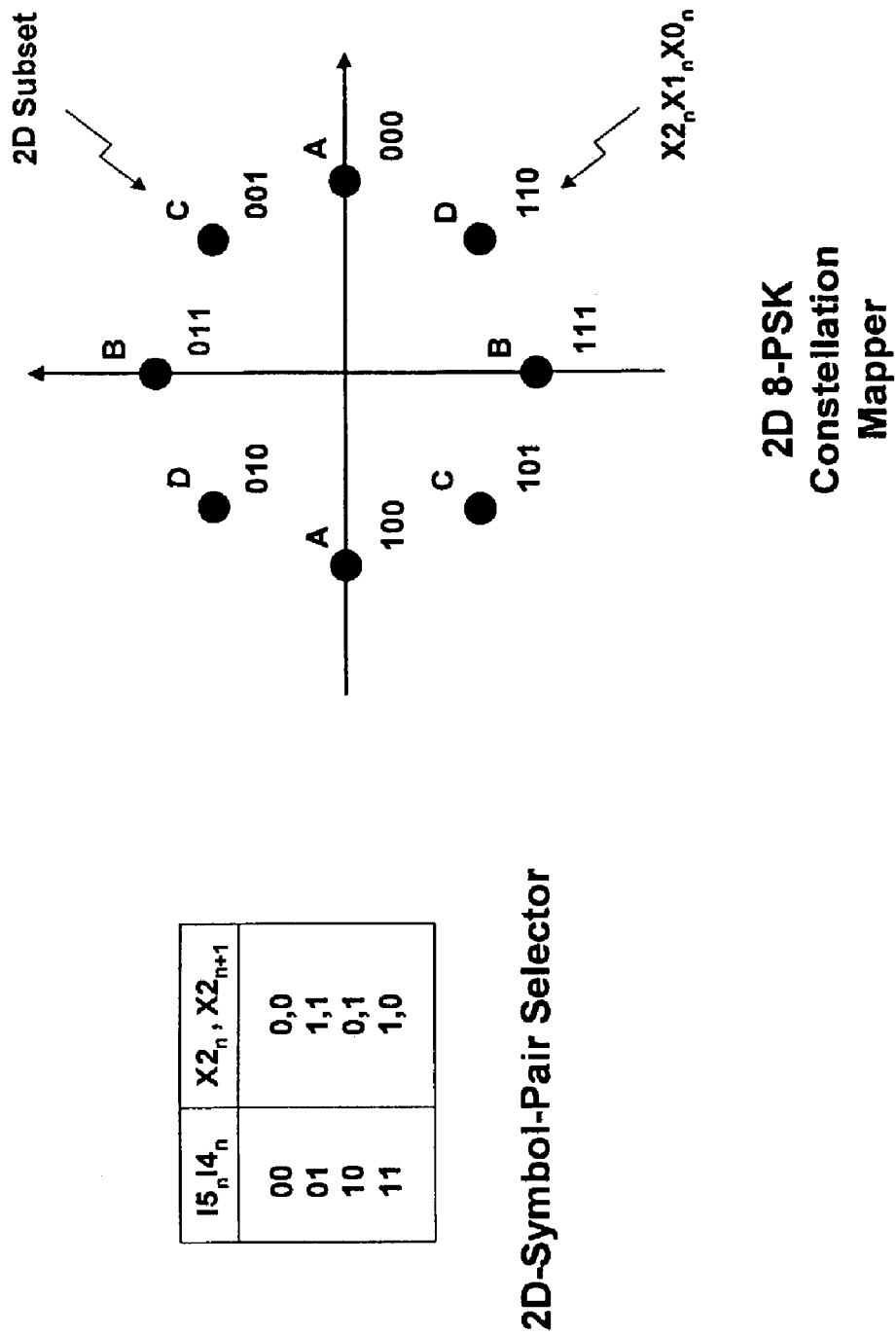
FIG. 4 shows an 8-PSK constellation mapper for the encoder of FIG. 2.
Figure 5:
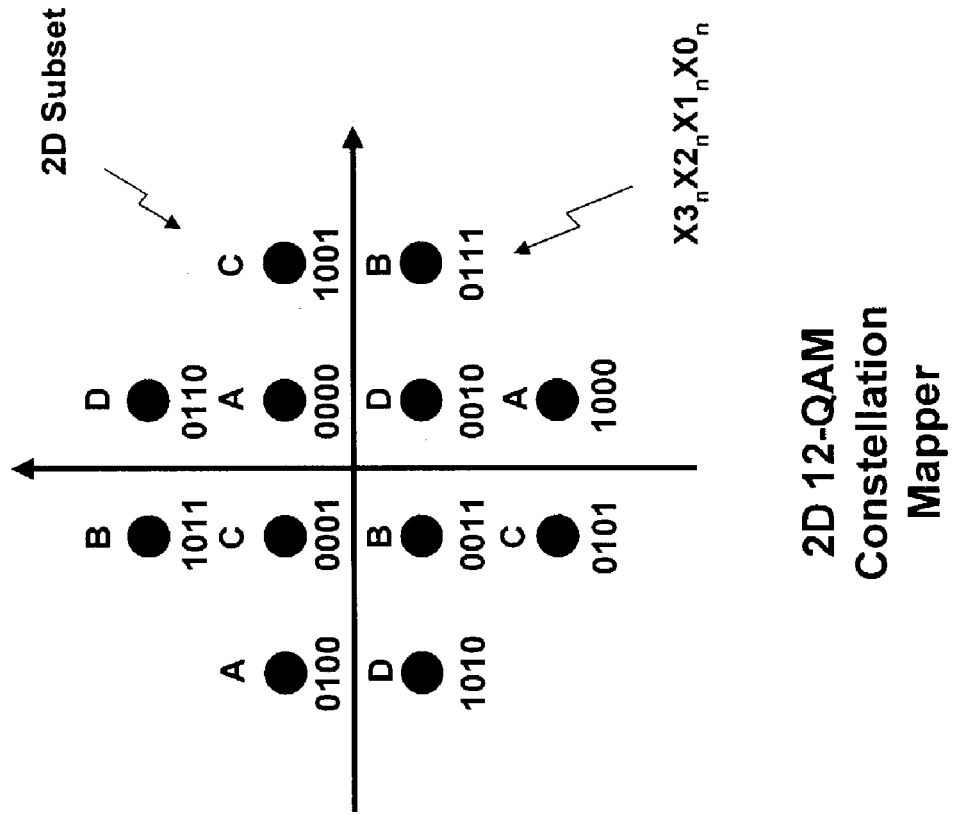
FIG. 5 shows a 12-QAM constellation mapper for the encoder of FIG. 2.

FIG. 2 shows an embodiment for a 4-dimensional 8-state trellis encoder with a 4-PSK, 8-PSK, or multiple-amplitude 12-QAM signal constellation that is used in the present invention. FIGS. 3–5 illustrate the 4-PSK, 8-PSK, and 12-QAM constellation mappers.

Consider first the case with 4-PSK by referring to FIG. 3. Shown on the right side of FIG. 3 is a constituent 2D 4-PSK constellation used in each $n^{th}$ signaling interval, each symbol $P_n$ of the constellation being specified by a bit pattern $X1_n X0_n$. For consistency with other larger constellations, the 2D 4-PSK constellation is partitioned into four 2D subsets, A, B, C, and D. Each 2D subset here comprises only one 2D symbol and is also specified by a bit pattern $X1_n X0_n$. For example, $X1_n X0_n=00$ specifies 2D subset A, $X1_n X0_n=11$ specifies 2D subset B, $X1_n X0_n=01$ specifies 2D subset C, and $X1_n X0_n=10$ specifies 2D subset D.

When two such 2D 4-PSK constellations used in two successive $n^{th}$ and $n+1^{th}$ 2D signaling intervals are concatenated together, a 4D 4-PSK constellation is formed. The 4D constellation has 16 4D signal points, each 4D point, $(P_n, P_{n+1})$, being a concatenation of two 2D symbols, $P_n$ and $P_{n+1}$.

The 4D 4-PSK constellation is then partitioned into eight 4D subsets as shown on the left side of FIG. 3. Each 4D subset comprises two 2D-subset pairs. For example, 4D subset 0 comprises two 2D-subset pairs, $(X1_nX0_n, X1_{n+1}X0_{n+1})=(00, 00)$ and $(11, 11)$, or equivalently, $(A, A)$ and $(B, B)$. Each 2D-subset pair here has only one 4D point. The partition is such that the minimum Euclidean distance between the 4D points in each 4D subset is maximized.

Based on the 8-subset partition of the 4D 4-PSK constellation, an 8-state trellis encoder is then constructed. As shown by the thicker lines in the lower portion of FIG. 2, the 8-state trellis encoder takes three input data bits, $I3_n$, $I2_n$, and $I1_n$, in each pair of 2D signaling intervals. For easy reference, each such pair of 2D signaling intervals is referred to as a 4D signaling interval. Two of them, $I2_n$ and $I1_n$, enter an embedded convolutional encoder 201. Convolutional encoder 201 has three internal bits, $S2_n$, $S1_n$, and $S0_n$, stored in three delay elements 201a~201c, each delay element being clocked at a frequency of 1/(2T). The three internal bits define the current state $S2_nS1_nS0_n$ of the 8-state trellis encoder.

Through the logical operations of convolutional encoder 201 shown in FIG. 2, the two input data bits, $I2_n$ and $I1_n$, along with the three internal bits, $S2_n$, $S1_n$, and $S0_n$, determine both the three output bits, $I2_n$, $I1_n$, and $S0_n$, of encoder 201 and the next state $S2_{n+2}S1_{n+2}S0_{n+2}$ of the 8-state trellis encoder. Note that the $\oplus$ shown in encoder 201 is the logical operation "exclusive or".

The three output bits, $I2_n$, $I1_n$, and $S0_n$, are then used to select a 4D subset $I2_nI1_nS0_n$. The remaining uncoded input data bit $I3_n$ is next used in 2D-subset-pair selector 203 to select a 2D-subset pair from the selected 4D subset. For 4-PSK, since each 2D-subset pair has only one 4D point, a 4D point $(P_n, P_{n+1})$ is uniquely specified through 2D constellation mapper 207 once a 2D-subset pair is selected. The two 2D symbols, $P_n$ and $P_{n+1}$, of the specified 4D point are then delivered to modulator 103 and transmitted to multi-path channel 105 in two successive 2D signaling intervals. The 8-state trellis code is constructed so that the minimum Euclidean distance between any two possible sequences of symbols at the output of the trellis encoder is maximized.

To terminate the 8-state trellis code, one can let $I2_n=S1_n$ in the 4D signaling interval before the last one, and $I2_n=S1_n$ and $I1_n=S2_n \oplus S1_n$ in the last 4D signaling interval of a data frame. This is especially desired for packet communication.

Extension to the case with 8-PSK is straightforward. Shown on the right side of FIG. 4 is a constituent 2D 8-PSK constellation, each symbol $P_n$ of the constellation being specified by a bit pattern $X2_nX1_nX0_n$. The 2D 8-PSK constellation is partitioned into four 2D subsets, A, B, C, and D. Each 2D subset is specified by a bit pattern $X1_nX0_n$ as in the case with 4-PSK. Unlike the case with 4-PSK, each 2D subset here has two 2D symbols.

When two such 2D 8-PSK constellations used in two successive 2D signaling intervals are concatenated together, a 4D 8-PSK constellation is formed. The 4D constellation has 64 4D signal points. Just like the case with 4-PSK, the 4D 8-PSK constellation is partitioned into eight 4D subsets as shown on the left side of FIG. 3. Each 4D subset comprises two 2D-subset pairs. Each 2D-subset pair here has four 4D points.

Referring back to FIG. 2, the 8-state trellis encoder now takes five input data bits, $I5_n$, $I4_n$, $I3n$, $I2_n$, and $I1_n$, in each 4D signaling interval. Just like the case with 4-PSK, the two input data bits, $I2_n$ and $I1_n$, along with the three internal bits, $S2_n$, $S1_n$, and $S0_n$, determine both the three output bits, $I2_n$, $I1_n$, and $S0_n$, of encoder 201 and the next state $S2_{n+2}S1_{n+2}S0_{n+2}$ of the 8-state trellis encoder. The three output bits, $I2_n$, $I1_n$, and $S0_n$, of encoder 201 are then used to select a 4D subset $I2_nI1_nS0_n$. The uncoded input data bit $I3_n$ is next used to select a 2D-subset pair from the selected 4D subset. The remaining two uncoded input data bits, $I5_n$ and $I4_n$, are then used to specify one of the four 4D points in each 2D-subset pair. This is done by first passing $I5_n$ and $I4_n$ through 2D-symbol-pair selector 205 to become $X2_n$ and $X2_{n+1}$ according to the table shown on the left side of FIG. 4. $X2_n$ is then used to specify a 2D symbol, $P_n$, from the first 2D subset of the selected 2D-subset pair, and $X2_{n+1}$ is next used to specify a 2D symbol, $P_{n+1}$, from the second 2D subset of the selected 2D-subset pair. The two 2D symbols, $P_n$ and $P_{n+1}$, of the specified 4D point are then delivered to modulator 103 and transmitted to multi-path channel 105 in two successive 2D signaling intervals.

Further extension to the case with multiple-amplitude 12-QAM is also straightforward. Shown on the right side of FIG. 5 is a constituent 2D 12-QAM constellation, each symbol $P_n$ of the constellation being specified by a bit pattern $X3_nX2_nX1_nX0_n$. The 2D 12-QAM constellation is partitioned into four 2D subsets, A, B, C, and D. Each 2D subset is specified by a bit pattern $X1_nX0_n$ as in the case with 4-PSK. Each 2D subset here has three 2D symbols. Note that the bit pattern $X3_nX2_n=11$ is not used.

When two such 2D 12-QAM constellations used in two successive 2D signaling intervals are concatenated together, a 4D 12-QAM constellation is formed. The 4D constellation has 144 4D signal points. Just like the case with 4-PSK, the 4D 12-QAM constellation is partitioned into eight 4D subsets as shown on the left side of FIG. 3. Each 4D subset comprises two 2D-subset pairs. Each 2D-subset pair here has nine 4D points.

Referring back to FIG. 2, the 8-state trellis encoder now takes six input data bits, $I6_n$, $I5_n$, $I4_n$, $I3_n$, $I2_n$, and $I1_n$, in each 4D signaling interval. Just like the case with 4-PSK, the two input data bits, $I2_n$ and $I1_n$, along with the three internal bits, $S2_n$, $S1_n$, and $S0_n$, determine both the three output bits, $I2_n$, $I1_n$, and $S0_n$, of encoder 201 and the next state $S2_{n+2}S1_{n+2}S0_{n+2}$ of the 8-state trellis encoder. The three output bits, $I2_n$, $I1_n$, and $S0_n$, of encoder 201 are then used to select a 4D subset $I2_nI1_nS0_n$. The uncoded input data bit $I3_n$ is next used to select a 2D-subset pair from the selected 4D subset. The remaining three uncoded input data bits, $I6_n$, $I5_n$, and $I4_n$, are then used to specify one of the nine 4D points in each 2D-subset pair. This is done by first passing $I6_n$, $I5_n$, and $I4_n$ through 2D-symbol-pair selector 205 to become $X3_nX2_n$ and $X3_{n+1}X2_{n+1}$ according to the table shown on the left side of FIG. 5. $X3_nX2_n$ is then used to specify a 2D symbol, $P_n$, from the first 2D subset of the selected 2D-subset pair, and $X3_{n+1}X2_{n+1}$ is next used to specify a 2D symbol, $P_{n+1}$, from the second 2D subset of the selected 2D-subset pair. The two 2D symbols, $P_n$ and $P_{n+1}$, of the specified 4D point are then delivered to modulator 103 and transmitted to multi-path channel 105 in two successive 2D signaling intervals.

Note that only eight out of nine 4D points in each 2D-subset pair are needed here. This is taken care of by not having both bit patterns $X3_nX2_n$ and $X3_{n+1}X2_{n+1}$ equal to 10 in the 2D-symbol-pair selector of FIG. 5, which corresponds to a 4D point that requires more transmitted signal power.

Even further extensions to bigger PSK or multiple-amplitude QAM constellations with the same 8-state trellis code are obvious. The only changes in FIG. 2 are that the trellis encoder will take more input data bits in each 4D signaling interval, and those extra input data bits will be used in 2D-symbol-pair-selector 205 to select a 2D-symbol pair, $(P_n, P_{n+1})$, or a 4D point, from a 2D-subset pair with more 4D points.

Figure 6:
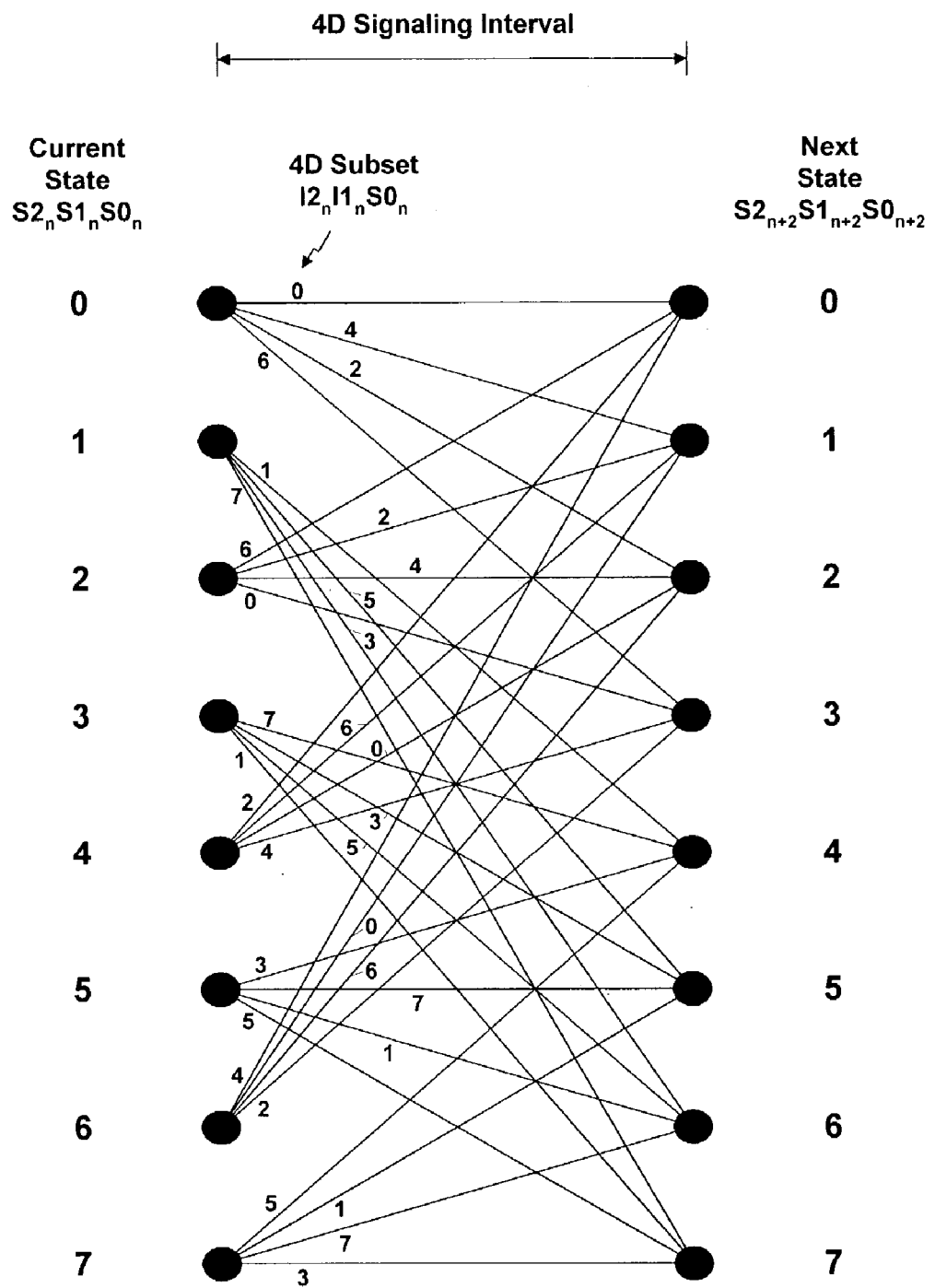
FIG. 6 shows a conventional one-stage trellis diagram that represents the operations of the 4D 8-state trellis encoder of FIG. 2.

FIG. 6 shows a conventional single-stage trellis diagram that represents the operations of the 4D 8-state trellis encoder. In the diagram, the encoder can assume eight different states. From each current state $S2_n S1_n S0_n$, the encoder can go to one of four different next states $S2_{n+2} S1_{n+2} S0_{n+2}$, which depends on the values of the input data bits, $I2_n$ and $I1_n$. For each such state transition, the encoder outputs three bits, $I2_n$, $I1_n$, and $S0_n$, which are used to select a 4D subset $I2_n I1_n S0_n$ of the constellation. For example, when the encoder goes from current state 0 to next state 1, it selects 4D subset 4. The remaining uncoded input data bits of the trellis encoder are then used to specify a 4D point, $(P_n, P_{n+1})$, from the selected 4D subset for transmission.

As mentioned earlier, until the present invention, this single-stage trellis diagram has been invariably used to decode the 4D 8-state trellis code in the receiver. For example, for AWGN channels, the Viterbi decoder for such a code proceeds as follows: For each of the eight current states of the code, the decoder maintains a surviving path and a path metric. The surviving path for a state is the most likely sequence of symbols, $(P_{n-k}, P_{n-k+1}, \ldots, P_{n-1})$, that leads to the state. And the path metric for the state is the squared Euclidean distance between that most likely sequence and the received sequence of channel-impaired symbols, $(\tilde{P}_{n-k}, \tilde{P}_{n-k+1}, \ldots, \tilde{P}_{n-1})$.

After the docoder receives another channel-impaired 4D point, $(\tilde{P}_n, \tilde{P}_{n+1})$, it first finds the 4D point in each of the eight 4D subsets that is closest to the received 4D point. It then calculates a branch metric for each of the eight 4D subsets, which is the squared Euclidean distance between the received 4D point and the closest 4D point in that 4D subset. The decoder then updates the surviving path and path metric for each of the eight next states as follows. Referring to the trellis diagram of FIG. 6, for each next state J, J=0, 1, . . . , or 7, it can be reached from four different current states. For each such current state, the decoder adds together the path metric associated with that current state and the branch metric for the 4D subset associated with the state transition from that current state to the next state J. The decoder then compares the four such sums. The smallest sum and its associated sequence of symbols become the path metric and surviving path for the next state J. The associated sequence of symbols here is simply the concatecation of the surviving path for the winning current state and the closest 4D point in the 4D subset associated with the winning state transition. A final decision on an earlier transmitted 4D point, $(P_{n-k}, P_{n-k+1})$, can then be made by first finding the next state with the smallest path metric and then tracing back the surviving path associated with that state.

As noted earlier, for multi-path channels that require a DFE in the receiver, using the single-stage trellis diagram shown in FIG. 6 for decoding a 2N-dimensional trellis code, N>1, rules out the possibility of combining the DFE and decoder together.

The fact that the DFE and 2N-dimensional trellis decoder using a single-stage trellis diagram cannot be combined together can be understood as follows. In the beginning of a 2N-dimensional signaling interval (which is equal to N 2D signaling intervals), each surviving path of the decoder contains tentative decisions on all the earlier received 2D symbols, $\tilde{P}_{n-1}, \tilde{P}_{n-2}, \tilde{P}_{n-3}$, and so on. This is sufficient for calculating the ISI contained in the next received 2D symbol $\tilde{P}_n$. However, since the surviving paths will not be updated until the entire next 2N-dimensional signal point, $(\tilde{P}_n, \tilde{P}_{n+1}, \ldots, \tilde{P}_{n+N-1})$, is received, the DFE will not have all the tentative decisions on the past symbols available when it tries to calculate the ISI contained in the received 2D symbols, $\tilde{P}_{n+1}, \tilde{P}_{n+2}, \ldots$, and $\tilde{P}_{n+N-1}$ that follows $\tilde{P}_n$. This makes the joint DFE and decoder crippled.

Figure 7:
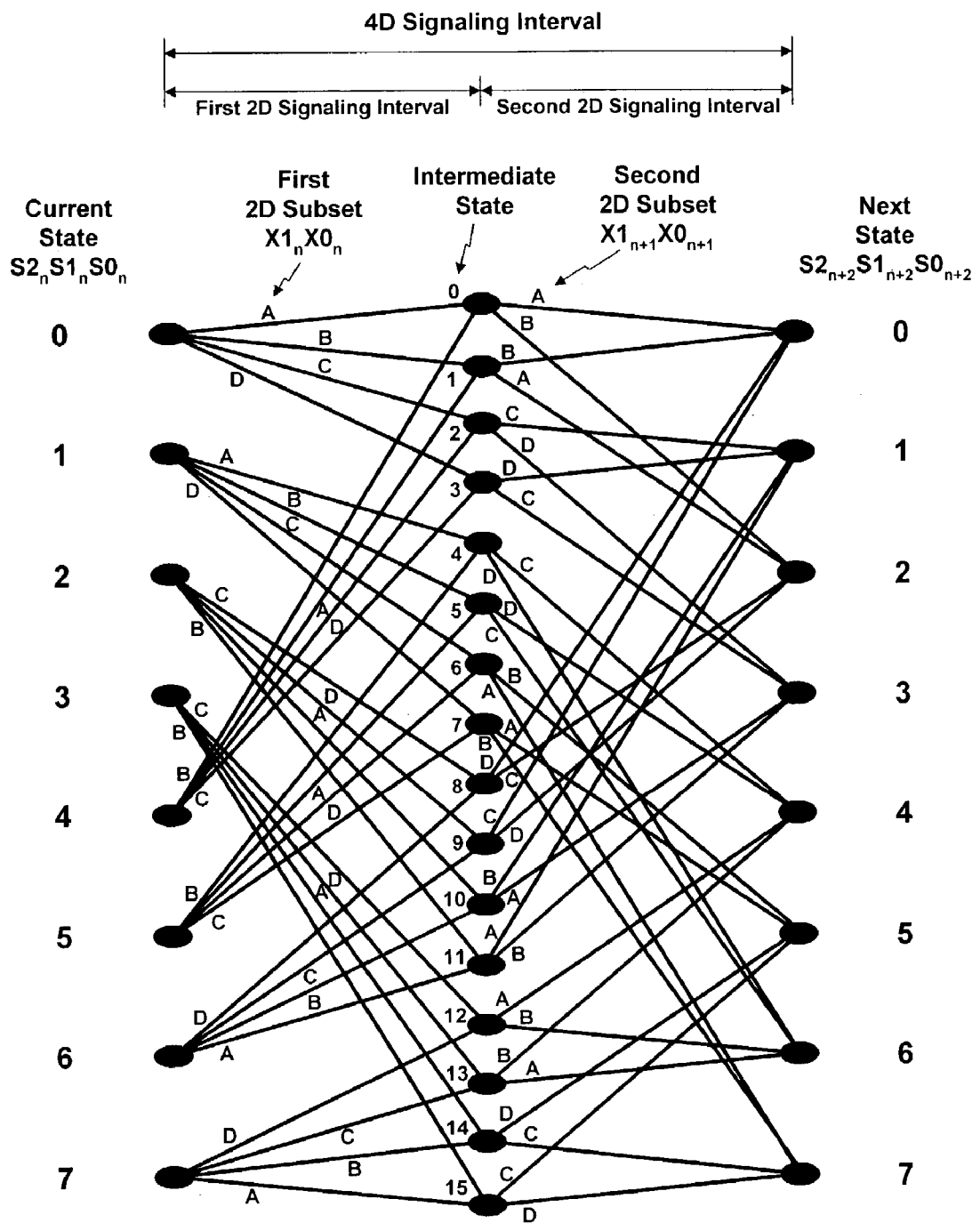
FIG. 7 shows a two-stage trellis diagram that is equivalent to the single-stage trellis diagram of FIG. 6 according to the present invention.

According to the principles of the present invention, FIG. 7 shows a two-stage trellis diagram that is equivalent to the single-stage trellis diagram of FIG. 6. It can therefore be also used to decode the 4D 8-state trellis code of FIG. 2, and more importantly, to make the joint DFE and decoder feasible for the 4D code when the code is used to transmit signal through a multi-path channel having severe ISI.

Referring to FIG. 7, the encoder still assumes eight different states in the beginning and ending of each 4D signaling interval. Those beginning and ending states are still referred to as current and next states, and specified by $S2_n S1_n S0_n$ and $S2_{n+2} S1_{n+2} S0_{n+2}$, respectively, as in FIG. 6. However, before the encoder goes from a current to a next state, it first goes to an intermediate state. There are 16 such intermediate states. From each current state $S2_n S1_n S0_n$, the encoder can go to four different intermediate states, and from each intermediate state, the encoder can go to two different next states $S2_{n+2} S1_{n+2} S0_{n+2}$. For example, from current state 0 or 4, the encoder can go to four different intermediate states 0, 1, 2, and 3. From intermediate state 0 or 1, the encoder can go to two different next states 0 and 2. And from intermediate state 2 or 3, the encoder can go to two different next states 1 and 3.

As discussed earlier, each transition from a current state to a next state in FIG. 6 is associated with a 4D subset of a 4D constellation. The 4D constellation is a concatenation of a first 2D constellation and a second 2D constellation. Each 4D subset comprises two 2D-subset pairs. Each 2D-subset pair is a concatenation of a first 2D subset of the first 2D constellation and a second 2D subset of the second 2D constellation. For example, the transition from current state 0 to next state 1 is associated with 4D subset 4, which comprises two 2D-subset pairs, (C, C) and (D, D).

Now in FIG. 7, each transition from a current to an intermediate state is associated with a first 2D subset of the first 2D constellation, and each transition from an intermediate state to a next state is associated with a second 2D subset of the second 2D constellation. For example, the first 2D subsets associated with the transitions from current state 0 to intermediate states 2 and 3 are C and D, respectively. And the second 2D subsets associated with the transitions from intermediate states 2 and 3 to next state 1 are C and D, respectively.

To prove that the trellis diagram of FIG. 7 is equivalent to that of FIG. 6, the followings need to be shown: (1) From each current state in FIG. 7, the encoder can go to the same next states as in FIG. 6; And (2) each transition from a current to a next state in FIG. 7 is associated with the same 4D subset as in FIG. 6.

It is easy to see that from each current state 0, 2, 4, or 6 in FIG. 7, the encoder can go to four different next states 0, 1, 2, and 3; and from each current state 1, 3, 5, or 7, the encoder can go to four different next states 4, 5, 6, and 7, which is identical to FIG. 6.

Next, it is also easy to see that in FIG. 7, the encoder has two different ways to reach from a current state to a next state. Each way is associated with a 2D-subset pair of the 4D constellation. Each transition from a current state to a next state therefore is associated with two 2D-subset pairs. It can be shown that those two 2D-subset pairs form a 4D subset as defined in FIG. 3, and the 4D subset is identical to that in FIG. 6. For example, the encoder can reach from current state 0 to next state 1 through either intermediate state 2 or 3. Each way is associated with a 2D-subset pair (C, C) or (D, D). The transition from current state 0 to next state 1 in FIG. 7 therefore is associated with two 2D-subset pairs, (C, C) and (D, D), which is 4D subset 4 as defined in FIG. 3, and is identical to that in FIG. 6.

As mentioned above, the two-stage trellis diagram of FIG. 7 can also be used to decode the 4D 8-state trellis code shown in FIG. 2. For example, for AWGN channels, the Viterbi decoder using such a diagram proceeds as follows: In the beginning of each 4D signaling interval, the decoder maintains a surviving path and a path metric for each of the eight current states of the code. The surviving path for a state is still the most likely sequence of symbols, ($P_{n-k}$, $P_{n-k+1}$, ..., $P_{n-1}$), that leads to the state. And the path metric for the state is the squared Euclidean distance between that most likely sequence and the received sequence of channel impaired symbols, ($\tilde{P}_{n-k}$, $\tilde{P}_{n-k+1}$, ..., $\tilde{P}_{n-1}$).

After the docoder receives the first 2D symbol, $\tilde{P}_n$, of another channel-impaired 4D point, ($\tilde{P}_n$, $\tilde{P}_{n+1}$), it first finds the 2D symbol in each of the four 2D subsets of the first 2D constellation that is closest to the received 2D symbol. It then calculates a branch metric for each of the four 2D subsets, which is the squared Euclidean distance between the received 2D symbol and the closest 2D symbol in that 2D subset. The decoder then updates the surviving path and path metric for each of the 16 intermediate states as follows. Referring to the trellis diagram of FIG. 7, for each intermediate state J, J=0, 1, ..., or 15, it can be reached from two different current states. For each such current state, the decoder adds together the path metric associated with that current state and the branch metric for the 2D subset associated with the state transition from that current state to the intermediate state J. The decoder then compares the two such sums. The smaller sum and its associated sequence of symbols become the path metric and the surviving path for the intermediate state J. The associated sequence of symbols here is simply the concatecation of the surviving path for the winning current state and the closest 2D symbol in the 2D subset associated with the winning state transition. A final decision on an earlier transmitted 2D symbol, $P_{n-k}$, can then be made by first finding the intermediate state with the smallest path metric and then tracing back the surviving path associated with that state.

After the docoder receives the second 2D symbol, $\tilde{P}_{n+1}$, of the channel-impaired 4D point, ($\tilde{P}_n$, $\tilde{P}_{n+1}$), it again finds the 2D symbol in each of the four 2D subsets of the second 2D constellation that is closest to the received 2D symbol. It then calculates a branch metric for each of the four 2D subsets, which is the squared Euclidean distance between the received 2D symbol and the closest 2D symbol in that 2D subset. The decoder then updates the surviving path and path metric for each of the eight next states as follows. Referring to the trellis diagram of FIG. 7, for each next state L, L=0, 1, ..., or 7, it can be reached from four different intermediate states. For each such intermediate state, the decoder adds together the path metric associated with that intermediate state and the branch metric for the 2D subset associated with the state transition from that intermediate state to the next state L. The decoder then compares the four such sums. The smallest sum and its associated sequence of symbols become the path metric and surviving path for the next state L. The associated sequence of symbols here is simply the concatecation of the surviving path for the winning intermediate state and the closest 2D symbol in the 2D subset associated with the winning state transition. A final decision on an earlier transmitted 2D symbol, $P_{n-k+1}$, can then be made by first finding the next state with the smallest path metric and then tracing back the surviving path associated with that state.

Generally speaking, with the present invention, each 2N-dimensional trellis code, N>1, can be decoded using an N-stage trellis diagram wherein each state transition in the $j^{th}$ stage of the diagram, J=1, 2, ..., or N, is associated with a 2D subset of the $j^{th}$ 2D constellation of a 2N-dimensional constellation. As a result, after the decoder receives any 2D symbol of a 2N-dimensional signal point, it can calculate immediately the branch metrics associated with the state transitions for that 2D symbol, and then update the surviving paths and path metrics using those branch metrics.

For AWGN channels, using the N-stage trellis diagram to decode a 2N-dimensional trellis code has the same performance but a higher decoder complexity than using the single-stage trellis diagram. There is thus no advantage in using the N-stage trellis diagram in this case. However, for multi-path channels that require a DFE in the receiver, using the N-stage trellis diagram for decoding a 2N-dimensional trellis code makes the joint DFE and decoder feasible. As a result, it becomes beneficial to use a 2N-dimensional trellis code for such a multi-path channel.

Figure 8:
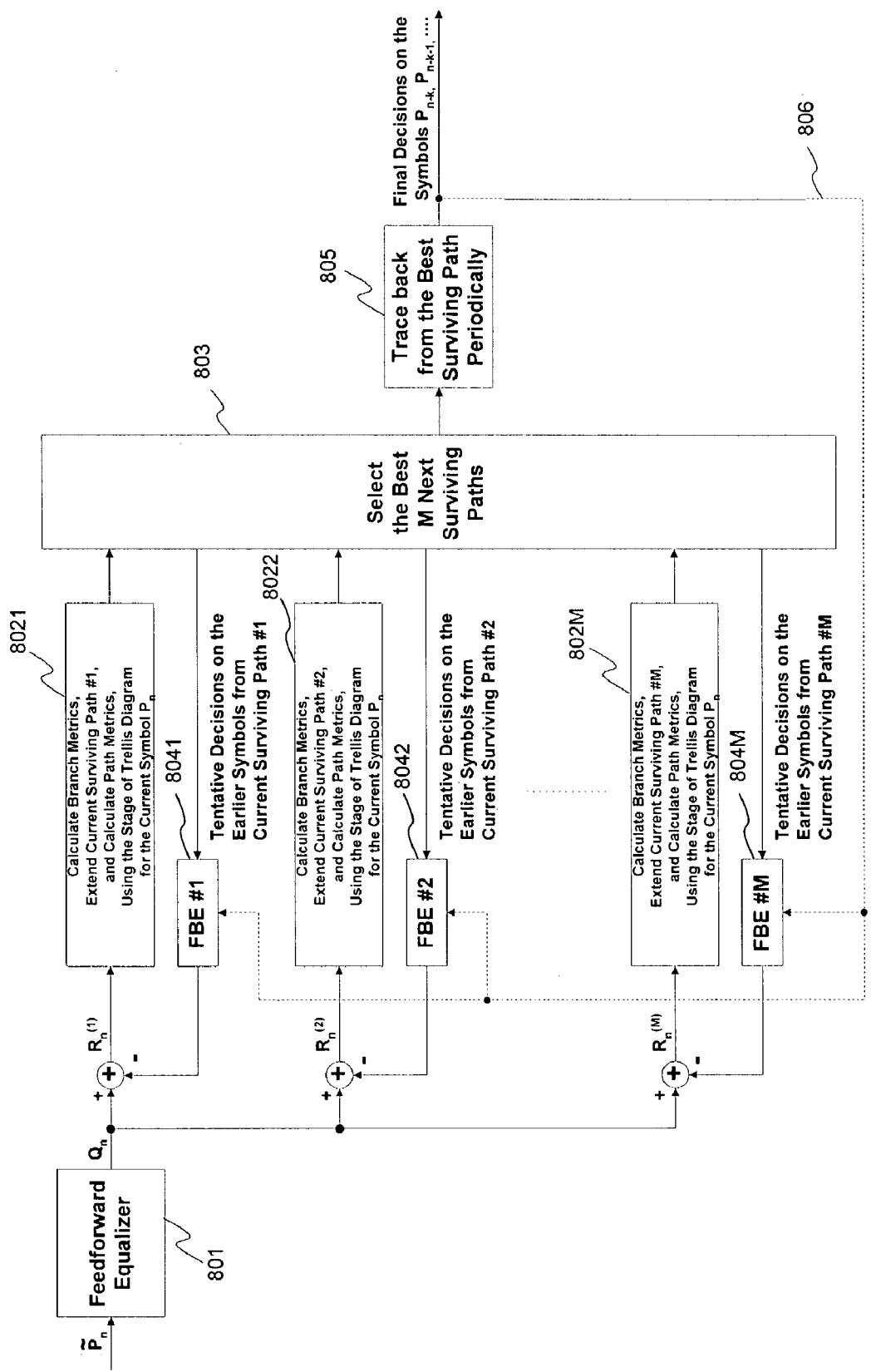
FIG. 8 shows a joint DFE and path-oriented mult-dimensional trellis decoder that is based on a multi-stage trellis diagram according to the present invention.

FIG. 8 shows a preferred embodiment for a joint DFE and decoder that is based on the multi-stage trellis diagram according to the present invention and is referred to as a joint DFE and path-oriented mult-dimensional trellis decoder. This joint DFE and decoder can be used to decode a mult-dimensional trellis code when the code is used to transmit signal through a severe multi-path channel that requires a DFE in the receiver.

The operations of this joint DFE and decoder proceed as follows. In the beginning of each 2D signaling interval, the decoder keeps the best M current surviving paths, M being a design parameter that depends on many things, including the code, channel, performance requirement, and complexity. Each path comprises a sequence of tentative decisions on the past transmitted 2D symbols, $P_{n-1}$, $P_{n-2}$, and so on. Each path is also associated with a path metric and a state. The path metric is a distance measure that indicates how good the path is. The state tells which state the path leads to, so that the decoder knows how to extend the path.

Referring to FIG. 8, each received channel-impaired 2D symbol, $\tilde{P}_n$, is first passed through a traditional feedforward equalizer 801 to become $Q_n$. Feedforward equalizer 801 is typically meant to remove the ISI from the future transmitted 2D symbols, $P_{n+1}$, $P_{n+2}$, and so on, that is contained in $\tilde{P}_n$.

For each $J^{th}$ current surviving path, J=1, 2, ..., or M, a feedback equalizer FBE #J is then used to remove the ISI from the past transmitted 2D symbols, $P_{n-1}$, $P_{n-2}$, and so on, that is contained in $Q_n$. The tentative decisions on the past transmitted 2D symbols, $P_{n-1}$, $P_{n-2}$, and so on, that are needed by the feedback equalizer FBE #J are provided by the $J^{th}$ current surviving path. Blocks 8041 through 804M show this step of processing.

The resulting received signal sample, $R_n^{(J)}$, which is ideally an ISI-free received signal sample for the current transmitted 2D symbol $P_n$, is then used by the decoder to calculate the branch metric for each state transition from the state associated with the $J^{th}$ current surviving path, extend the $j^{th}$ current surviving path along each such state transition to obtain a number of candidate paths, and calculate the path metric for each candidate path, using the stage of trellis diagram for the current 2D symbol $P_n$. Blocks 8021 through 802M show this step of processing.

The candidate paths extended from all of the M current surviving paths are then put together. As processed at block 803, the decoder selects the best M next surviving paths from those candidate paths, which are the paths with the smaller path metrics. The decoder can then find the next surviving path with the smallest path metric, and trace back from that path as processed at block 805 to make a final decision on an earlier transmitted 2D symbol, $P_{n-k}$. If so desired, this final decision may also be used to substitute the corresponding tentative decision used in feedback equalizers 8041 through 804M in the next 2D signaling interval, as shown by dotted connections 806 in FIG. 8. Note that the decoder does not have to make a final decision on an earlier transmitted 2D symbol in each 2D signaling interval. It can do that on a periodical basis, with a period longer than a 2D signaling interval.

Two examples of the above decoding process are provided herein below, so that the present invention will become better understood.

As a first example of the above decoding process, assume that the 4D 8-state trellis encoder of FIG. 2 is used. Assume also that the stage of trellis diagram for the current 2D symbol $P_n$ is the first-stage trellis diagram shown in FIG. 7. Assume further that the $J^{th}$ current surviving path leads to current state 0 in FIG. 7. There are four state transitions from current state 0 to intermediate states 0, 1, 2, and 3 in FIG. 7, each transition being associated with a 2D subset, A, B, C, and D, of a 2D constellation, respectively. The decoder first finds the 2D symbol in each of the four 2D subsets that is closest to the received signal sample, $R_n^{(J)}$. It then calculates a branch metric for each state transition from current state 0, which is the squared Euclidean distance between $R_n^{(J)}$ and the closest 2D symbol in the 2D subset associated with that state transition. The decoder then extends the $J^{th}$ current surviving path along each state transition to obtain four candidate paths, and calculate their path metrics. Each candidate path is the concatenation of the $J^{th}$ current surviving path and the closest 2D symbol in the 2D subset associated with a state transition from current state 0. The path metric for that candidate path is the sum of the path metric of the $J^{th}$ current surviving path and the branch metric associated with that state transition. The 4M candidate paths extended from all of the M current surviving paths are then put together. The decoder selects the best M next surviving paths from those 4M candidate paths, which are the paths with the smaller path metrics.

As a second example, assume still that the 4D 8-state trellis code of FIG. 2 is used. Assume, however, that the stage of trellis diagram for the current 2D symbol $P_n$ is the second-stage trellis diagram shown in FIG. 7. Assume further that the $L^{th}$ surviving path leads to intermediate state 0 in FIG. 7. There are two state transitions from intermediate state 0 to next states 0 and 2 in FIG. 7, each transition being associated with a 2D subset, A and B, of a 2D constellation, respectively. The decoder first finds the 2D symbol in each of the two 2D subsets that is closest to the received signal sample, $R_n^{(L)}$. It then calculates a branch metric for each state transition from intermediate state 0, which is the squared Euclidean distance between $R_n^{(L)}$ and the closest 2D symbol in the 2D subset associated with that state transition. The decoder then extends the $L^{th}$ current surviving path along each state transition to obtain two candidate paths, and calculate their path metrics. Each candidate path is the concatenation of the $L^{th}$ current surviving path and the closest 2D symbol in the 2D subset associated with a state transition from intermediate state 0. The path metric for that candidate path is the sum of the path metric of the $L^{th}$ current surviving path and the branch metric associated with that state transition. The 2M candidate paths extended from all of the M current surviving paths are then put together. The decoder selects the best M next surviving paths from those 2M candidate paths, which are the paths with the smaller path metrics.

The fact that the joint DFE and decoder can eliminate or significantly mitigate the error propagation effect of the DFE can be understood as follows. As long as the number M of surviving paths is large enough, one of the surviving paths will comprise the correct tentative decisions on all of the past transmitted 2D symbols. Consequently, for that surviving path, the ISI from the past transmitted 2D symbols can be completely removed from the received signal sample, $Q_n$, through the feedback filter, which solves the error propagation effect of the DFE.

The decoder in FIG. 8 is referred to as path-oriented, because in selecting the best M next surviving paths, it is not required that those M paths have to lead to M different states. More than one path can lead to the same state, which is in contrast to the Viterbi decoder or reduced-state Viterbi decoder, as explained below.

Figure 9:
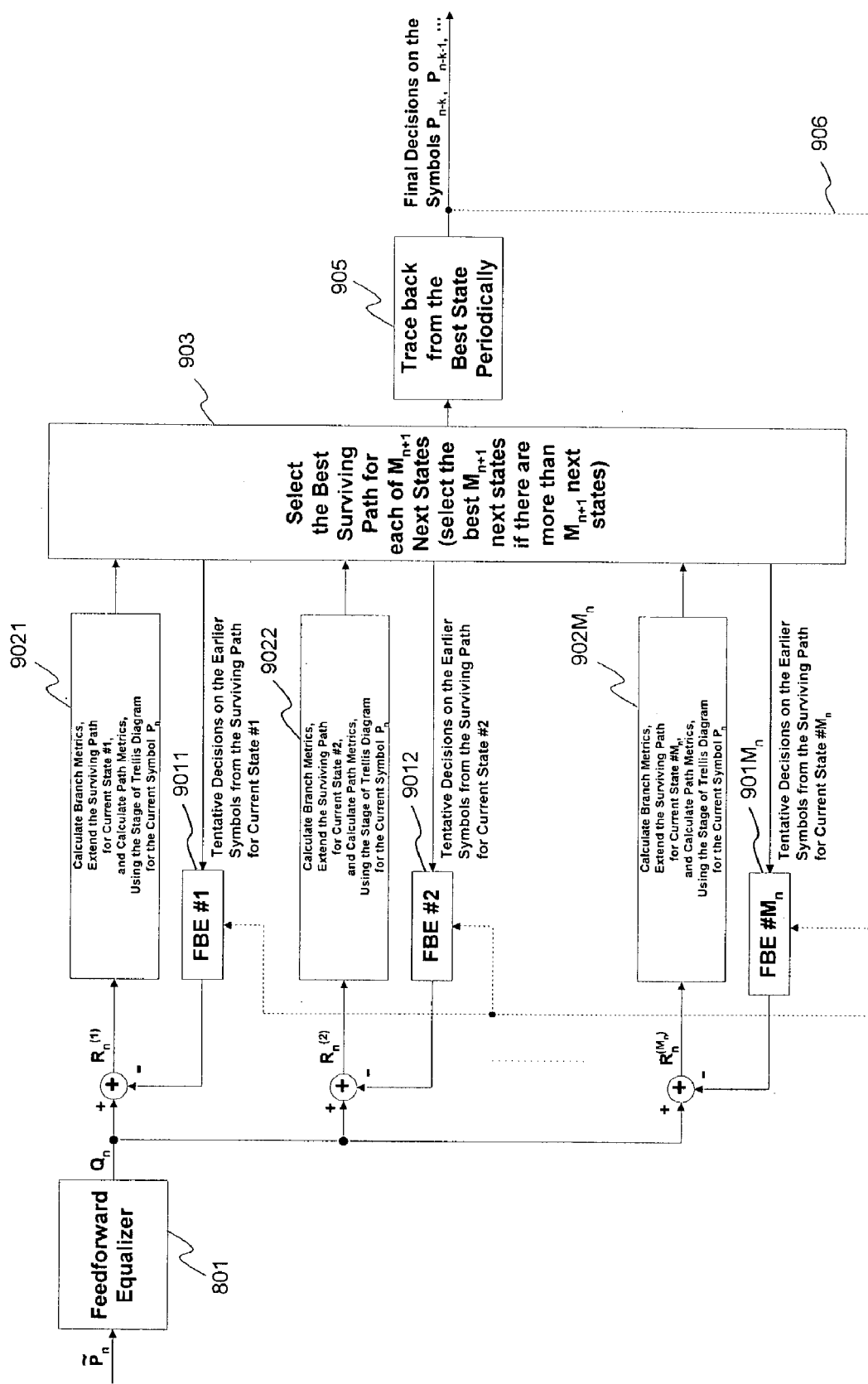
FIG. 9 shows an alternative joint DFE and state-oriented mult-dimensional trellis decoder that is based on a multi-stage trellis diagram according to the present invention.

FIG. 9 shows another preferred embodiment for the joint DFE and decoder that is based on the multi-stage trellis diagram according to the present invention. Here it is referred to as a joint DFE and state-oriented mult-dimensional trellis decoder. This joint DFE and decoder can also be used to decode a mult-dimensional trellis code when the code is used to transmit signal through a severe multi-path channel that requires a DFE in the receiver. The state-oriented decoder could be a Viterbi decoder or reduced-state Viterbi decoder, where each state of the code is associated with at most one surviving path.

When the decoder is a Viterbi decoder, the operations of the joint DFE and decoder proceed as follows. In the beginning of each 2D signaling interval, the decoder maintains a surviving path and a path metric for each beginning state in the stage of trellis diagram for the current 2D symbol $P_n$. Note that, depending on the stage of trellis diagram, the beginning state here could be a current or intermediate state of the mult-dimensional trellis code. Each surviving path comprises a sequence of tentative decisions on the past transmitted 2D symbols, $P_{n-1}$, $P_{n-2}$, and so on. Each path metric is a distance measure that indicates how good its associated path is.

Referring to FIG. 9, each received channel-impaired 2D symbol, $\tilde{P}_n$, is again first passed through feedforward equalizer 801 to become $Q_n$. Feedforward equalizer 801 is meant to remove the ISI from the future transmitted 2D symbols, $P_{n+1}$, $P_{n+2}$, and so on, that is contained in $\tilde{P}_n$.

Denote the number of beginning states as $M_n$, which could be a variable that depends on n. For each $J^{th}$ beginning state, $J=1, 2, \ldots,$ or $M_n$, a feedback equalizer FBE #J is then used to remove the ISI from the past transmitted 2D symbols, $P_{n-1}$, $P_{n-2}$, and so on, that is contained in $Q_n$. The tentative decisions on the past transmitted 2D symbols, $P_{n-1}$, $P_{n-2}$, and so on, that are needed by the feedback equalizer are provided by the surviving path associated with the $J^{th}$ beginning state. Blocks 9011 through 901M$_n$ show this step of processing.

As in FIG. 8, the resulting received signal sample, $R_n^{(J)}$, which is ideally an ISI-free received signal sample for the current transmitted 2D symbol $P_n$, is then used by the decoder to calculate the branch metric for each state transition from the $J^{th}$ beginning state, extend the surviving path associated with the $J^{th}$ beginning state along each such state transition to obtain a number of candidate paths, and calculate the path metric for each candidate path, using the stage of trellis diagram for the current 2D symbol $P_n$. This processing is shown at blocks 9021 through 902M$_n$.

As processed at block 903, for each of the $M_{n+1}$ ending states in the stage of trellis diagram for the current 2D symbol $P_n$, the decoder first compares the path metrics associated with all of the candidate paths that lead to that ending state, and the candidate path with the smallest path metric becomes the surviving path associated with that ending state. Note that, depending on the stage of trellis diagram, the ending state here could be an intermediate or next state of the mult-dimensional trellis code. The decoder can then find the ending state with the smallest path metric, and trace back from the surviving path associated with that ending state as processed at block 905 to make a final decision on an earlier transmitted 2D symbol, $P_{n-k}$. If so desired, this final decision may also be used to substitute the corresponding tentative decision used in feedback equalizers 9011 through 901M$_n$ in the next 2D signaling interval, as shown by dotted connections 906 in FIG. 9. Note that the decoder does not have to make a final decision on an earlier transmitted 2D symbol in each 2D signaling interval. It can do that on a periodical basis, with a period longer than a 2D signaling interval.

When the parameter, $M_{n+1}$, is chosen to be less than the number of ending states for some n, a reduced-state Viterbi decoder is resulted. In that case, the decoder will select a surviving path for each of the best $M_{n+1}$ ending states. The best $M_{n+1}$ ending states could be, for example, those states whose surviving paths have smaller path metrics.

Although the present invention has been described with reference to the preferred embodiments, it will be understood that the invention is not limited to the details described thereof. Various substitutions and modifications have been suggested in the foregoing description, and others will occur to those of ordinary skill in the art.

For example, the mult-dimensional trellis code may have an embedded convolutional code other than that shown in FIG. 2, a number of states other than 8, a number of dimensions other than 4, or a constituent 2D constellation other than 4-PSK, 8-PSK, or 12-QAM. The constituent constellation may also have a number of dimensions other than 2. For example, the constituent constellation may have more than two dimensions or only one dimension. The present invention also applies to the case where the trellis code is 2D and its constituent constellation is one dimensional, even though a 2D trellis code is usually not referred to as a mult-dimensional trellis code. In the last case, the two coordinates of each 2D signal point of the 2D trellis code are transmitted in two different signaling intervals.

Although two specific arrangements for the joint DFE and decoder are shown in details, other arrangements of the joint DFE and decoder that is based on the concept of the multi-stage trellis diagram are possible. Therefore, all such substitutions and modifications are intended to be embraced within the scope of the invention as defined in the appended claims.

What is claimed is:

1. A method of using an N-dimensional trellis code to communicate data over a multi-path channel, comprising the steps of:
    (a) encoding said data into a sequence of N-dimensional signal points, each signal point being a concatenation of N/M M-dimensional symbols with N/M being an integer greater than one, each symbol being selected from an M-dimensional constellation;
    (b) modulating and transmitting said N/M M-dimensional symbols of an N-dimensional signal point to said multi-path channel in at least two different signaling intervals;
    (c) receiving channel-impaired N/M M-dimensional symbols; and
    (d) removing interference on a current received M-dimensional symbol using a decision on a past received M-dimensional symbol.

2. The method of claim 1, wherein said step (d) includes using at least one decision feedback equalizer to remove said interference.

3. The method of claim 1, wherein said step (d) includes using a decoding process to recover said data.

4. The method of claim 3, wherein said decision on a past received M-dimensional symbol in step (d) is provided by said decoding process.

5. The method of claim 4, wherein said current and past M-dimensional symbols belong to a same N-dimensional signal point.

6. The method of claim 3, wherein said encoding in step (a) includes using a finite state machine that goes from a current state to a next state while generating an N-dimensional signal point, and said decoding process is based on a multi-stage trellis diagram that goes from said current state to at least one intermediate state before reaching said next state.

7. The method of claim 1, wherein N equals to 4 and M equals to 2.

8. The method of claim 1, wherein said M-dimensional constellation in step (a) is a 2-dimensional 4-PSK.

9. The method of claim 1, wherein said M-dimensional constellation in step (a) is a 2-dimensional 8-PSK.

10. The method of claim 1, wherein said M-dimensional constellation in step (a) is a 2-dimensional multiple-amplitude QAM constellation.

11. The method of claim 1, wherein N equals to 2 and M equals to 1.

12. A method for receiving signal and recovering data from a communication channel, comprising the steps of:
    (a) receiving channel-impaired M-dimensional symbols of a sequence of N-dimensional signal points from said communication channel, each M-dimensional symbol being selected from an M-dimensional constellation, each N-dimensional signal point being a concatenation of N/M M-dimensional symbols with N/M being an integer greater than one, said N-dimensional signal point being generated by an N-dimensional trellis encoder while said encoder goes from a current state to a next state; and
    (b) decoding said channel-impaired M-dimensional symbols to recover said data using a decoding process, wherein said decoding process is based on a multi-stage trellis diagram that goes from said current state to at least one intermediate state before reaching said next state.

13. The method of claim 12, wherein said communication channel is a multi-path channel.

14. The method of claim 13, wherein said step (b) further includes using at least one decision feedback equalizer that uses a decision on a past received M-dimensional symbol to remove interference on a current received M-dimensional symbol.

15. The method of claim 14, wherein said decision is provided by said decoding process.

16. The method of claim 15, wherein said current and past M-dimensional symbols belong to a same N-dimensional signal point.

17. A method for receiving signal and recovering data from a communication channel, comprising the steps of:
(a) receiving channel-impaired M-dimensional symbols of a sequence of N-dimensional signal points from said communication channel, each M-dimensional symbol being selected from an M-dimensional constellation, each N-dimensional signal point being a concatenation of N/M M-dimensional symbols with N/M being an integer greater than one, said N-dimensional signal point being generated by an N-dimensional trellis encoder; and
(b) decoding said channel-impaired M-dimensional symbols to recover said data using a decoding process, said decoding process maintaining a plurality of surviving paths, each path being a sequence of tentative decisions on a plurality of past received M-dimensional symbols, wherein said decoding process updates said surviving paths more than once upon the reception of N/M channel-impaired M-dimensional symbols of an N-dimensional signal point.

18. The method of claim 17, wherein each updating of surviving paths is based on a stage of a multi-stage trellis diagram that corresponds to an M-dimensional symbol of an N-dimensional signal point.

19. The method of claim 17, wherein said communication channel is a multi-path channel.

20. The method of claim 19, wherein said step (b) further includes removing interference on a current received M-dimensional symbol by using a plurality of decisions on a past received M-dimensional symbol in a plurality of decision feedback equalizers, each surviving path providing a decision to an associated decision feedback equalizer.

21. The method of claim 20, wherein said current and past M-dimensional symbols belong to a same N-dimensional signal point.

22. An apparatus of using an N-dimensional trellis code to communicate data over a multi-path channel, comprising:
an N-dimensional trellis encoder for encoding said data into a sequence of N-dimensional signal points, each signal point being a concatenation of N/M M-dimensional symbols with N/M being an integer greater than one, each symbol being selected from an M-dimensional constellation;
a transmitting unit for modulating and transmitting said N/M M-dimensional symbols of an N-dimensional signal point to said multi-path channel in at least two different signaling intervals;
a receiving unit for receiving channel-impaired N/M M-dimensional symbols; and
an intersymbol interference remover for removing interference on a current received M-dimensional symbol using a decision on a past received M-dimensional symbol.

23. The apparatus of claim 22, wherein said remover includes at least one decision feedback equalizer to remove said interference.

24. The apparatus of claim 22, wherein said remover includes a decoder to recover said data.

25. The apparatus of claim 24, wherein said decision on a past received M-dimensional symbol is provided by said decoder.

26. The apparatus of claim 25, wherein said current and past M-dimensional symbols belong to a same N-dimensional signal point.

27. The apparatus of claim 24, wherein said encoder includes a finite state machine that goes from a current state to a next state while generating an N-dimensional signal point, and said decoder is based on a multi-stage trellis diagram that goes from said current state to at least one intermediate state before reaching said next state.

28. The apparatus of claim 22, wherein N equals to 4 and M equals to 2.

29. The apparatus of claim 22, wherein said M-dimensional constellation is a 2-dimensional 4-PSK.

30. The apparatus of claim 22, wherein said M-dimensional constellation is a 2-dimensional 8-PSK.

31. The apparatus of claim 22, wherein said M-dimensional constellation is a 2-dimensional multiple-amplitude QAM constellation.

32. The apparatus of claim 22, wherein N equals to 2 and M equals to 1.

33. An apparatus for receiving signal and recovering data from a communication channel, comprising:
a receiving unit for receiving channel-impaired M-dimensional symbols of a sequence of N-dimensional signal points from said communication channel, each M-dimensional symbol being selected from an M-dimensional constellation, each N-dimensional signal point being a concatenation of N/M M-dimensional symbols with N/M being an integer greater than one, said N-dimensional signal point being generated by an N-dimensional trellis encoder while said encoder goes from a current state to a next state; and
a decoder for decoding said channel-impaired M-dimensional symbols to recover said data, wherein said decoder is based on a multi-stage trellis diagram that goes from said current state to at least one intermediate state before reaching said next state.

34. The apparatus of claim 33, wherein said communication channel is a multi-path channel.

35. The apparatus of claim 34, wherein said decoder further includes at least one decision feedback equalizer that uses a decision on a past received M-dimensional symbol to remove interference on a current received M-dimensional symbol.

36. The apparatus of claim 35, wherein said decision is obtained from said decoder.

37. The apparatus of claim 36, wherein said current and past M-dimensional symbols belong to a same N-dimensional signal point.

38. An apparatus for using a mult-dimensional trellis code to transmit data in a wireless local area network, comprising an encoder that encodes said data into a sequence of mult-dimensional signal points, each signal point having at least three coordinates.

39. The apparatus of claim 38, wherein said trellis code is four-dimensional.

40. The apparatus of claim 38, wherein said transmitting includes a modulator for modulating a single carrier with said coordinates.

41. An apparatus for receiving signal and recovering data from a communication channel, comprising:
a receiving unit for receiving channel-impaired M-dimensional symbols of a sequence of N-dimensional signal points from said communication channel, each M-dimensional symbol being selected from an M-dimensional constellation, each N-dimensional signal point being a concatenation of N/M M-dimensional symbols with N/M being an integer greater than one, said N-dimensional signal point being generated by an N-dimensional trellis encoder; and a decoder for decoding said channel-impaired M-dimensional symbols to recover said data, said decoder maintaining a plurality of surviving paths, each path being a sequence of tentative decisions on a plurality of past received M-dimensional symbols, wherein said decoder updates said surviving paths more than once upon the reception of N/M channel-impaired M-dimensional symbols of an N-dimensional signal point.

42. The apparatus of claim 41, wherein each updating of surviving paths is based on a stage of a multi-stage trellis diagram that corresponds to an M-dimensional symbol of an N-dimensional signal point.

43. The apparatus of claim 41, wherein said communication channel is a multi-path channel.

44. The apparatus of claim 43, wherein said decoder further includes an intersymbol interference remover that removes interference on a current received M-dimensional symbol by using a plurality of decisions on a past received M-dimensional symbol in a plurality of decision feedback equalizers, each surviving path providing a decision to an associated decision feedback equalizer.

45. The apparatus of claim 44, wherein said current and past M-dimensional symbols belong to a same N-dimensional signal point.

* * * * *